(12) United States Patent  
Poddar

(10) Patent No.: US 7,652,379 B2  
(45) Date of Patent: Jan. 26, 2010

(54) BOND PAD STACKS FOR ESD UNDER PAD AND ACTIVE UNDER PAD BONDING

(75) Inventor: Anindya Poddar, Sunnyvale, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 117 days.

(21) Appl. No.: 11/895,779

(22) Filed: Aug. 27, 2007

(65) Prior Publication Data

US 2009/0026621 A1    Jan. 29, 2009

Related U.S. Application Data

(60) Provisional application No. 60/961,609, filed on Jul. 23, 2007.

(51) Int. Cl.  
*H01L 23/48* (2006.01)

(52) U.S. Cl. .................. 257/758; 257/760; 438/622

(58) Field of Classification Search .............. 257/760, 257/758; 438/622  
See application file for complete search history.

(56) References Cited

U.S. PATENT DOCUMENTS 7,056,820 B2 *  6/2006  Cole et al. ............... 438/618  
7,242,102 B2 *  7/2007  Kang et al. .............. 257/786

* cited by examiner

*Primary Examiner*—Douglas M Menz  
(74) *Attorney, Agent, or Firm*—Dergosits & Noah LLP

(57) ABSTRACT

A combination of layout improvements and inner layer dielectric (ILD) material improvements provides a bond pad stack that is robust for both gold (Au) and copper (Cu) wires in circuits with only one or two pad metal layers. The layout improvements involve removing all vias between the top metal layer and the metal layers below top metal in the area under the passivation opening (where probe tips and the bond wire are placed). This allows for a more homogenous material without via discontinuities, thereby reducing stress concentration points in the ILD. The ILD material improvement involves adding a layer of silicon nitride in addition to the silicon oxide layer. Traditionally, the ILD consists of either spun-on or high density plasma (HDP) oxides. The growth of the thin layer of silicon nitride over the oxide on the topmost ILD layer provides a composite of significantly increased toughness and prevents cracks or other damage from propagating into the underlying active circuits and routing.

8 Claims, 2 Drawing Sheets

US 7,652,379 B2

BOND PAD STACKS FOR ESD UNDER PAD AND ACTIVE UNDER PAD BONDING

PRIORITY CLAIM

This application claims the benefit of U.S. Provisional Application No. 60/961,609, filed on Jul. 23, 2007, by Anindya Poddar and titled "Bond Pad Stacks For ESD Under Pad and Active Under Pad Bonding." Provisional Application No. 60/961,609 is hereby incorporated by reference herein in its entirety.

FIELD OF THE INVENTION

The present invention relates to integrated circuit structures and, in particular, to a robust bond pad stack for both gold and copper wires in circuits with only one or two pad metal layers.

BACKGROUND OF THE INVENTION

Integrated circuit structures typically include a number of input/output (I/O) pads that facilitate electrical connection of the integrated circuit to external devices. One widely used electrical connection technique is wire bonding, which involves thermosonically bonding a thin gold (Au) or copper (Cu) wire to the I/O pad (often referred to as a "bond pad").

FIG. 1 shows a cross-section of a standard bond pad stack 100. The bond pad stack 100 includes a number of aluminum (Al) or Cu metallization layers, layers M1-M4 in this case, that are separated from one another by inner dielectric (ILD) material 102, typically deposited silicon dioxide ($SiO_2$). In order to connect the various metallization layers M1-M4, conductive vias 104 are often formed beneath the bond pad to provide desired circuit characteristics. A layer of passivation material 106, typically silicon nitride, is formed over the top metallization layer, layer M4 in this case, and patterned to expose an upper surface area 108 of the M4 layer to serve as a bond pad.

Conventional wire bonding techniques impart a significant amount of stress to the standard bond pad design, often resulting in cracks in the inner layer (ILD) that underlies the bond pads. These cracks tend to propagate through the circuit structure and can cause current leakage and/or performance degradation.

Because of the problems that may be caused by wire bonding, it is common to avoid placing active circuit elements in regions of the integrated circuit die that are directly below the bond pads. While this helps reduce the risk of cracking, since the bond pads occupy a significant percentage if the total surface are of the die, prohibiting placement of active circuits beneath the bond pads results in an undesirable increase in die size. Also, while in the past there have typically been three or four metal layers overlying the active circuit elements in the bond pad area, it is desirable in an increasing number of circuit applications to have the flexibility to place active circuitry directly beneath the bond pad.

FIG. 2 shows a known bond pad stack design 200 intended to address the above-discussed issues. The bond pad stack design 200 includes a layer of inner layer dielectric (ILD) 202, e.g., silicon nitride, formed over active circuitry 204. An upper metal layer 206 is formed on the ILD 202. Rather than providing for wire bonding directly to bond pads of the upper metal layer, as in the case of the standard FIG. 1 bond pad stack, the bond pad stack design 200 provides an extra passivation nitride layer 208 over the upper metal layer 206. A layer of metal, e.g., aluminum (Al) or copper (Cu), is then formed and patterned to provide bond pads 210 on the extra passivation layer.

While the FIG. 2 bond pad stack 200 provides a more robust design than the FIG. 1 standard bond pad stack 100, thereby enhancing the viability of under bond pad active circuitry, its implementation requires an additional mask layer and increases cost and cycle time.

SUMMARY OF THE INVENTION

The present invention uses a combination of layout improvements and inner layer dielectric (ILD) material improvements to provide a bond pad stack that is robust for both gold (Au) and copper (Cu) wires in circuits with only one or two pad metal layers. The layout improvements involve removing all vias between the top metal layer and the metal layers below top metal in the area under the passivation opening (where the probe tips and bond wire are placed). This allows for a more homogeneous material without via discontinuities, thereby reducing stress concentration point is the ILD. The ILD improvement involves adding a layer of silicon nitride in addition to the silicon oxide layer. Traditionally, ILD consists of either spun-on or high density plasma (HDP) oxides. The growth of the thin layer of silicon nitride over the oxide on the topmost ILD layer provides a composite of significantly increased toughness and prevents cracks or other damage from propagating into the underlying active circuits and routing. Implementation of this design requires one extra layer of material to be deposited or grown and uses the same via mask for the top metal layer via as the standard process flow. Thus, there are no additional mask costs and no new process steps are needed.

The features and advantages of the various aspects of the present invention will be more fully understood and appreciated upon consideration of the following detailed description of the invention and the accompanying drawings, which set forth an illustrative embodiment in which the concepts of the invention are utilized.

DETAILED DESCRIPTION OF THE INVENTION

Figure 1:
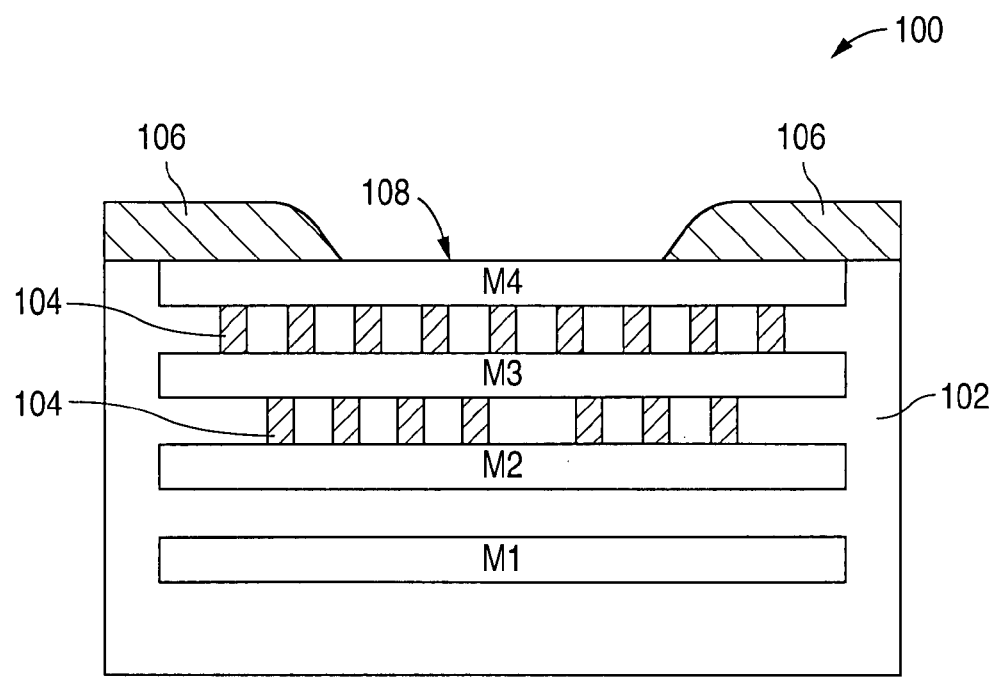
FIG. 1 is a cross section drawing illustrating a standard bond pad stack.
Figure 2:
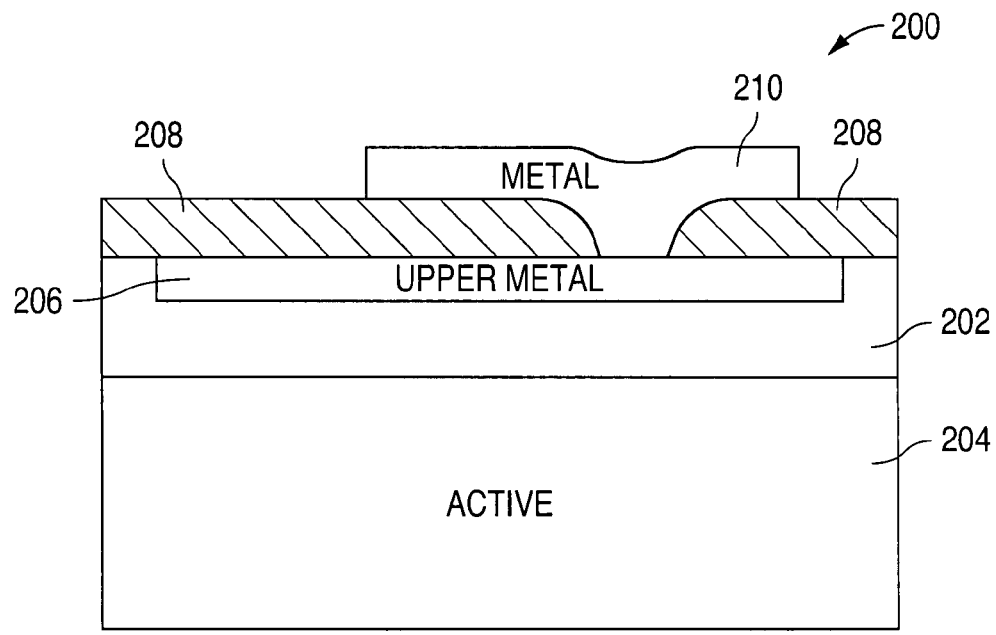
FIG. 2 is a cross section drawing illustrating a known bond pad stack design intended to address cracking damage caused by wire bonding to a bond pad.
Figure 3:
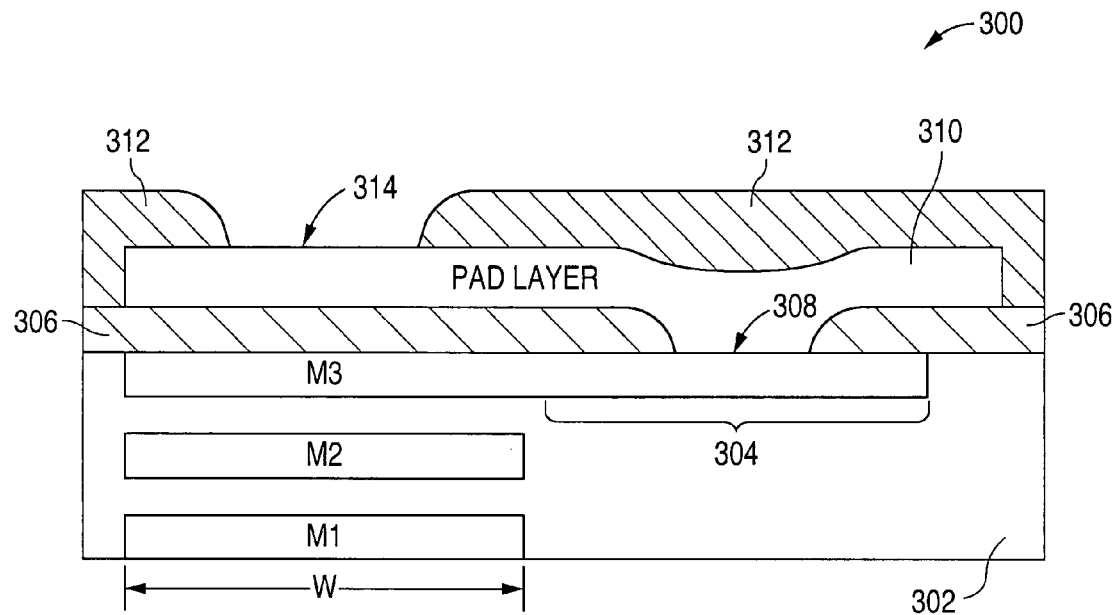
FIG. 3 is a cross section drawing illustrating a bond pad stack design in accordance with the concepts of the present invention.

FIG. 3 shows an embodiment of a bond pad stack 300 in accordance with the present invention. The FIG. 3 structure 300 includes a plurality of lower conductive layers M1 and M2 (e.g., Al or Cu), each of which has a width that is less than or equal to a maximum width w. Each of the lower conductive layers M1, M2 has dielectric material 302, typically deposited silicon oxide, formed therebetween. Those skilled in the art will appreciate that conductive vias may be formed between conductive layer M1 and conductive layer M2 in the well known manner. The bond pad stack 300 also includes a top conductive layer M3 (e.g., Al or Cu) that is formed over the lower conductive layers M1, M2 and separated from layers M1 and M2 by dielectric material 302. Again, those skilled in the art will appreciate that conductive vias may be formed between top conductive layer M3 and/or layers M1 and M2 in the well known manner. As shown in FIG. 3, the top conductive layer M3 has a second width that is greater than the maximum width w of the lower conductive layers M1 and M2 such that the top conductive layer has a first portion that is formed over the lower conductive layers M1 and M2 and a second portion 304 that extends beyond the width of the lower conductive layers M1 and M2.

A first passivation layer 306, typically silicon nitride, is deposited over the top conductive layer M3 and patterned to provide an opening through the first passivation layer 306 to expose an upper surface area 308 of the second portion 304 of the top conductive layer M3.

In accordance with the concepts of the invention, a conductive bond pad layer 310 (e.g., Al or Cu) is formed over the first passivation layer 306 and patterned such that the bond pad layer 310 has a first portion that extends over the first portion of the top conductive layer M3, but is separated from the top conductive layer M3 by the first passivation layer 306, and a second portion that extends over the second portion 304 of the top conductive layer M3 and through the opening in the first passivation layer 306 to provide electrical contact to the exposed upper surface area 308 of the top conductive layer M3, as shown in FIG. 3.

A second passivation layer 312, e.g., silicon nitride or a benzocyclobutene (BCB)-based polymer dielectric, is formed over the conductive pad layer 310 and patterned to provide an opening in the second passivation layer 312 to expose an upper bond pad surface area 314 over the first portion of the conductive pad layer 310, i.e., over the lower conductive layers M1 and M2.

Those skilled in the art will appreciate that a wire bond structure may then be formed on the bond pad 314 in accordance with techniques well known in the industry.

Figure 4:
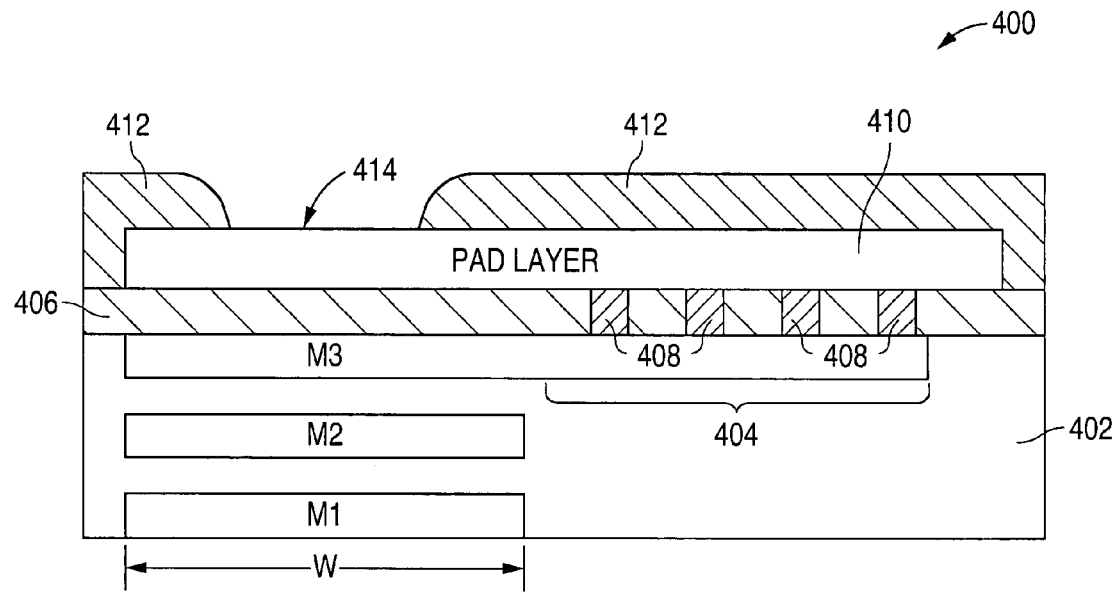
FIG. 4 is a cross section drawing illustrating an alternate embodiment of a bond pad stack design in accordance with the concepts of the present invention.

FIG. 4 shows an embodiment of a bond pad stack 300 in accordance with the present invention. The FIG. 4 structure 400 differs from the FIG. 3 structure 300 in that the structure 400 utilizes vias to provide the electrical connection between the conductive bond pad layer 410 and the top conductive layer M3.

More specifically, the FIG. 4 structure 400 includes a plurality of lower conductive layers M1 and M2 (e.g., Al or Cu), each of which has a width that is less than or equal to a maximum width w. Each of the lower conductive layers M1, M2 has dielectric material 402, typically deposited silicon oxide, formed therebetween. Those skilled in the art will appreciate that conductive vias may be formed between conductive layer M1 and conductive layer M2 in the well known manner. The bond pad stack 400 also includes a top conductive layer M3 (e.g., Al or Cu) that is formed over the lower conductive layers M1, M2 and separated from layers M1 and M2 by dielectric material 402. Again, those skilled in the art will appreciate that conductive vias may be formed between top conductive layer M3 and/or layers M1 and M2 in the well known manner. As shown in FIG. 4, the top conductive layer M3 has a second width that is greater than the maximum width w of the lower conductive layers M1 and M2 such that the top conductive layer has a first portion that is formed over the lower conductive layers M1 and M2 and a second portion 3404 that extends beyond the width of the lower conductive layers M1 and M2.

A first passivation layer 306, typically silicon nitride, is deposited over the top conductive layer M3 and patterned to provide via openings through the first passivation layer 406 to expose upper surface areas of the second portion 404 of the top conductive layer M3. Conductive vias 408 (e.g., Tu) are then formed through the via openings and into electric contact with the top conductive layer M3.

In accordance with the concepts of the invention, a conductive bond pad layer 410 (e.g., Al or Cu) is formed over the first passivation layer 406 and patterned such that the bond layer 410 has a first portion that extends over the first portion of the top conductive layer M3, but is separated therefrom by the first passivation layer 406, and a second portion that extends over the second portion 304 of the top conductive layer M3 into electrical contact with the vias 408 to provide electrical contact between the bond pad layer 410 and the exposed surface areas of the top conductive layer M3, as shown in FIG. 4.

A second passivation layer 412, e.g., silicon nitride or a benzocyclobutene (BCB)-based polymer dielectric, is formed over the conductive pad layer 410 and patterned to provide an opening in the second passivation layer 412 to expose an upper bond pad surface area 414 over the first portion of the conductive pad layer 410, i.e., over the lower conductive layers M1 and M2.

As exemplified by the FIG. 3 and FIG. 4 embodiments, implementation of a bond pad stack in accordance with the present invention requires that only one extra layer of material be deposited/grown and uses the same via mask for the top metal via as does a standard process flow. Thus, there are no additional mask costs or process steps that are need for any redistribution schemes.

It should be understood that the particular embodiments of the invention described above have been provided by way of example and that other modifications may occur to those skilled in the art without departing from the scope and spirit of the invention as express in the appended claims and their equivalents.

What is claimed is:

1. A bond pad structure for an integrated circuit, the structure comprising:

one or more lower conductive layers having dielectric material formed therebetween, each lower conductive layer having a width that is less than or equal to a first width;

a top conductive layer formed over the one or more lower conductive layers and having dielectric material formed between the top conductive layer and the one or more lower conductive layers, the top conductive layer having a second width that is greater than the first width such that the top conductive layer includes a first portion that is formed over the one or more lower conductive layers and a second portion that extends beyond the first width of the one or more lower conductive layers;

a first passivation layer formed on the top conductive layer and having an opening formed therethrough to expose an upper surface area of the second portion of the top conductive layer;

a conductive bond pad layer formed on the first passivation layer such that the conductive bond pad layer includes a first portion that is formed over the first portion of the top conductive layer and a second portion that extends through the opening in the first passivation layer and into electrical contact with the exposed upper surface area of the second portion of the top conductive layer; and a second passivation layer that is formed on the conductive bond pad layer and having an opening formed therethrough to expose a bond pad surface area of the first portion of the conductive bond pad layer such that the exposed bond pad surface area is formed over the one or more lower conductive layers.

2. The bond pad structure of claim 1, wherein the dielectric material comprises silicon oxide.

3. The bond pad structure of claim 1, wherein the dielectric material comprises deposited silicon oxide.

4. The bondpad structure of claim 1, wherein the first passivation layer comprises silicon nitride.

5. The bond pad structure of claim 1, wherein the bond pad layer comprises aluminum.

6. The bond pad layer of claim 1, wherein the second passivation layer comprises silicon nitride.

7. The bond pad layer of claim 1, wherein the second passivation layer comprises a benzocyclobutene (BCB)-based polymer dielectric.

8. A method of forming a bond pad stack structure, the method comprising:

forming one or more lower conductive layers having dielectric material formed therebetween, each lower conductive layer having a width that is less than or equal to a first width;

forming a top conductive layer over the one or more lower conductive layers such that the top conductive layer and the lower conductive layers have dielectric material formed therebetween, the top conductive layer having a second width that is greater than the first width such that the top conductive layer comprises a first portion that is formed over the one or more lower conductive layers and a second portion that extends beyond the first width of the one or more lower conductive layers;

forming a first passivation layer over the top conductive layer such that the first passivation layer has an opening formed therethrough to expose an upper surface area of the second portion of the top conductive layer;

forming a conductive bond pad layer over the first passivation layer such that the conductive bond pad layer includes a first portion formed over the first portion of the top conductive layer and a second portion that extends through the opening in the first passivation layer and into electrical contact with the top conductive layer; and forming a second passivation layer over the conductive bond pad layer and having an opening formed therethrough to expose a bond pad surface area of the first portion of the conductive bond pad layer such that the bond pad surface area is formed over the one or more lower conductive areas.

* * * * *